United States Patent
Iben et al.

(10) Patent No.: US 10,548,206 B2
(45) Date of Patent: Jan. 28, 2020

(54) AUTOMATED STATIC CONTROL

(71) Applicant: International Business Machines Corporation, Armonk, NY (US)

(72) Inventors: Icko E. T. Iben, Santa Clara, CA (US); John Thomas Kinnear, Jr., LaGrangeville, NY (US); Ho-Yiu Lam, Mountain View, CA (US); Sia Kai Julian Tan, Singapore (SG)

(73) Assignee: International Business Machines Corporation, Armonk, NY (US)

( * ) Notice: Subject to any disclaimer, the term of this patent is extended or adjusted under 35 U.S.C. 154(b) by 317 days.

(21) Appl. No.: 15/695,752

(22) Filed: Sep. 5, 2017

(65) Prior Publication Data

US 2019/0075640 A1 Mar. 7, 2019

(51) Int. Cl.
| | | |
|---|---|---|
| *H05F 3/06* | (2006.01) | |
| *G01R 29/12* | (2006.01) | |
| *G01R 31/00* | (2006.01) | |
| *H01T 23/00* | (2006.01) | |
| *H01T 19/04* | (2006.01) | |

(52) U.S. Cl.
CPC .............. *H05F 3/06* (2013.01); *G01R 29/12* (2013.01); *G01R 31/001* (2013.01); *H01T 19/04* (2013.01); *H01T 23/00* (2013.01)

(58) Field of Classification Search
CPC .................................................... H01T 23/00; H01T 19/04; H05F 3/06; G01R 29/12; G01R 31/001
See application file for complete search history.

(56) References Cited

U.S. PATENT DOCUMENTS

| | | | |
|---|---|---|---|
| 3,902,473 A | 9/1975 | Yeagle | |
| 4,630,167 A * | 12/1986 | Huggins | H05F 3/04 361/213 |
| 4,757,421 A * | 7/1988 | Mykkanen | H05F 3/04 361/231 |
| 5,010,777 A * | 4/1991 | Yehl | A61N 1/10 361/231 |
| 5,750,011 A * | 5/1998 | Ohmi | H05F 3/06 204/164 |
| 6,433,552 B1 * | 8/2002 | Williams | G01R 29/24 324/455 |
| 6,781,811 B2 | 8/2004 | Posadas | |

(Continued)

OTHER PUBLICATIONS

Noras et al., "Ion imbalances on an ionizer-controlled work surface," Journal of Electrostatics, vol. 64, Issue 5, May 2006, pp. 310-315. https://doi.org/10.1016/j.elstat.2005.07.004.

(Continued)

*Primary Examiner* — Scott Bauer
(74) *Attorney, Agent, or Firm* — James L. Olsen

(57) ABSTRACT

Embodiments of the present disclosure related to automated static control. A set of static sensor data may be obtained from two or more static sensors. The set of static sensor data may be analyzed to determine whether a static condition exists. In response to a determination that a static condition exists, a set of mobile static unit data may be collected from one or more mobile static units. The set of mobile static unit data may be analyzed to select a mobile static unit of the one or more mobile static units. An action may be transmitted to the selected mobile static unit, and the selected mobile static unit may be deployed to mitigate the static condition.

20 Claims, 6 Drawing Sheets

(56) References Cited

U.S. PATENT DOCUMENTS

| | | | |
|---|---|---|---|
| 6,873,515 B2* | 3/2005 | Chang | H05F 3/04 204/164 |
| 7,385,798 B2 | 6/2008 | Warren et al. | |
| 7,586,731 B2* | 9/2009 | Sato | H01T 19/04 361/231 |
| 7,924,544 B2 | 4/2011 | Richie et al. | |
| 9,046,373 B2 | 6/2015 | Bandyopadhyay et al. | |
| 9,516,855 B2* | 12/2016 | Rosen | A61L 9/22 |
| 2003/0201778 A1* | 10/2003 | Kraz | G01R 29/12 324/458 |
| 2006/0109603 A1* | 5/2006 | Kraz | H01T 23/00 361/220 |
| 2006/0186561 A1 | 8/2006 | Song et al. | |
| 2007/0159765 A1* | 7/2007 | Warren | H01T 19/04 361/212 |
| 2012/0092804 A1* | 4/2012 | Richie, Jr. | H01T 23/00 361/213 |
| 2014/0207282 A1 | 7/2014 | Angle et al. | |
| 2015/0312774 A1 | 10/2015 | Lau | |

OTHER PUBLICATIONS

Mell et al., "The NIST Definition of Cloud Computing," Recommendations of the National Institute of Standards and Technology, Special Publication 800-145, Sep. 2011, 7 pages, National Institute of Standards and Technology, Gaithersburg, MD.

"Static Control," SMC Products, SMC® Manufacturing Pneumatics Worldwide, printed: Aug. 28, 2017, 4 pages. http://www.smcusa.com/products/Static-Control.

"ANSI/ESDA/JEDEC JS-001-2012—Human Body Model (HBM)—Component Level," ESDA/JEDEC Joint Standard—For Electrostatic Discharge Sensitivity Testing, Apr. 2012, 53 pages, Electrostatic Discharge Association and JEDEC Solid State Technology Association.

"ESD TR53-01-06—Compliance Verification of ESD Protective Equipment and Materials," ESD Association Technical Report—for the Protection of Electrostatic Discharge Susceptible Items, 2006, 32 pages, Electrostatic Discharge Association.

"Electrostatic Sensor—Series IZD10/IZE11," SMC CAT.ES100-65B, 18 pages, © 2007 SMC Corporation. http://www.alliedelec.com/m/d/86161299e4497eb67c18be91b5ce1430.pdf.

"High-precision Electrostatic Sensor—SK series," Keyence Product Specifications, printed Aug. 28, 2017, pp. 1-3. http://www.keyence.com/products/static/electrostatic/sk/specs/index.jsp.

"Smart Electrostatic Sensor ZJ-SD," indiamart.com, printed Aug. 28, 2017, pp. 1-6. https://www.indiamart.com/proddetail/smart-electrostatic-sensor-zj-sd-13732987755.html.

West, B., "Ionization," White Paper, Sep. 1997, pp. 1-3, Desco Industries, Inc. http://www.esdsystems.com/whitepapers/wp_ionarticle.html.

"Air Ionization: How it works," Blog post, Apr. 17, 2013, pp. 1-4. http://blog.gotopac.com/2013/04/17/air-ionization-how-it-works/.

"Why Alpha," printed: Aug. 28, 2017, pp. 1-5, © 2017 NRD Static Control, LLC. https://nrdstaticcontrol.com/why-alpha.

\* cited by examiner

AUTOMATED STATIC CONTROL

BACKGROUND

The present disclosure relates generally to the field of electronics, and more particularly to static control solutions.

Static electricity is an imbalance of electric charges on a material. Static build-up occurs as materials become polarized by gaining or losing electrons (e.g., through the triboelectric effect). The imbalance of electric charges may remain on a material until electrostatic discharge (ESD) occurs. ESD neutralizes opposite charged surfaces, typically through electron flow (e.g., electrical arcs). Lightning is an extreme example of ESD. For example, the electric potential between a cloud and the ground can be millions of volts, which may cause an electrical arc from the clouds to the ground.

SUMMARY

Embodiments of the present disclosure include a method, computer program product, and system for automated static control. The method may include obtaining a set of static sensor data from two or more static sensors. The set of static sensor data may then be analyzed to determine whether a static condition exists. In response to determining that a static condition exists, a set of mobile static unit data can be obtained. The set of mobile static unit data may be analyzed in order to select a mobile static unit of the one or more mobile static units. The method may further include issuing an action to the selected mobile static unit, and deploying the selected mobile static unit to mitigate the static condition.

The above summary is not intended to describe each illustrated embodiment or every implementation of the present disclosure.

BRIEF DESCRIPTION OF THE DRAWINGS

The drawings included in the present disclosure are incorporated into, and form part of, the specification. They illustrate embodiments of the present disclosure and, along with the description, serve to explain the principles of the disclosure. The drawings are only illustrative of typical embodiments and do not limit the disclosure.

Figure 1:
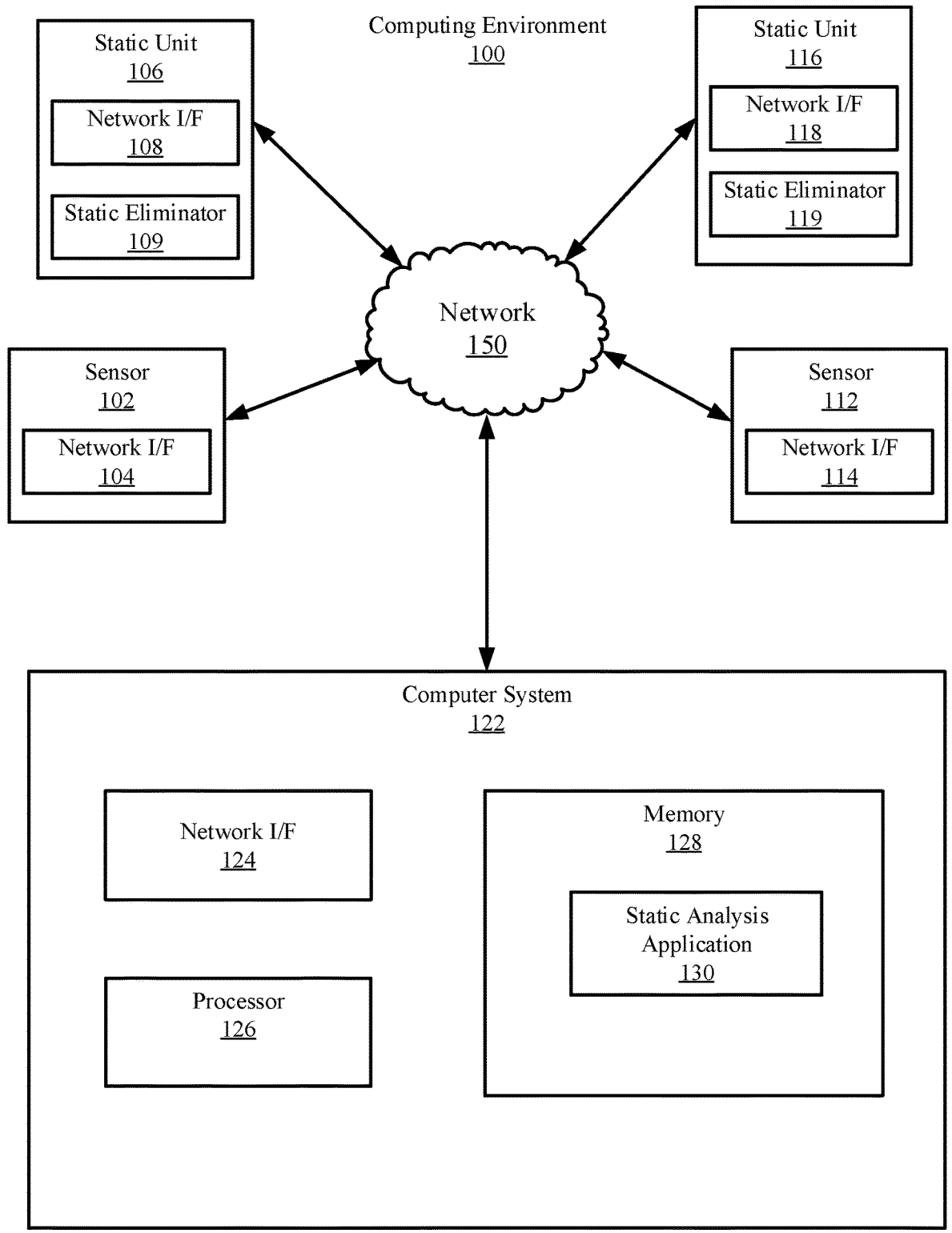
FIG. 1 is a block diagram illustrating an example computing environment in which illustrative embodiments of the present disclosure may be implemented.

While the embodiments described herein are amenable to various modifications and alternative forms, specifics thereof have been shown by way of example in the drawings and will be described in detail. It should be understood, however, that the particular embodiments described are not to be taken in a limiting sense. On the contrary, the intention is to cover all modifications, equivalents, and alternatives falling within the spirit and scope of the disclosure.

DETAILED DESCRIPTION

Aspects of the present disclosure relate generally to the field of electronics, and more particularly to static control solutions. While the present disclosure is not necessarily limited to such applications, various aspects of the disclosure may be appreciated through a discussion of various examples using this context.

Static electricity can cause complications in static-sensitive environments. For example, electronic components may be easily damaged by electrostatic discharge (ESD), as the energy released through ESD may overheat or even burn integrated circuits. Static may also be problematic in environments with flammable and ignitable materials. The energy released through ESD may be sufficient to ignite flammable mixtures (e.g., fuel, oil, toluene, etc.). Further, static electricity may cause complications in biosafety laboratories (e.g., cleanrooms), as the imbalance of electrons can attract particulates onto material surfaces. The particulates which latch onto the polarized materials (e.g., gowns, gloves, glasses, shoes) can enter a clean room, which may exceed airborne particulate cleanliness standards (e.g., International Standards Organization (ISO) Cleanroom Standards).

There are numerous strategies to prevent and/or eliminate static build-up. Ionizers are commonly used to eliminate static by neutralizing positively or negatively charged surfaces. Examples of ionizers include corona discharge ionizers and nuclear ionizers. Corona discharge ionizers generate positive and/or negative ions in the air, which may bind to charged surfaces, neutralizing the surfaces (e.g., the positive ions bind to negatively charged surfaces and the negative ions bind to positively charged surfaces). Nuclear ionizers utilize polonium 210 to generate positive and negative ions to neutralize static electricity. Specifically, nuclear ionizers emit alpha partials which interact with stable atoms and molecules near the surface of a material. The stable atoms and molecules are excited by the alpha particles, and share valence electrons, neutralizing charged objects and surfaces.

Humidifiers can also be used to reduce static. Static build-up and ESD occur frequently in air with a low relatively humidity. By increasing relative humidity with a humidifier, the air can be brought to a humidity level such that the air acts as a natural conductor, allowing charges to release into the air.

Though there are several solutions to eliminate static and control static build-up, static still impacts productivity and product reliability in the workspace. This is because static elimination units (e.g., humidifiers and ionizers) only treat a limited volume. Accordingly, a significant number of units may be required for large scale manufacturing processes and/or locations. Further, each unit may require close monitoring to ensure the neutralization process is delivered appropriately. Therefore, additional static units result in a higher operation cost.

Embodiments of the present disclosure include a smart static control solution. The static control solution may include obtaining static sensor data from a plurality of sensors disposed in an environment (e.g., a working environment, such as a microprocessor manufacturing facility).

The static sensor data may then be analyzed to determine whether a static condition exists, which may include comparing the static sensor data to a set of static thresholds. If a static condition is determined to exist, one or more static actions may be issued.

The aforementioned design overcomes complications noted in pre-existing solutions. Specifically, by continually monitoring static data and issuing static control actions, a single static eliminator unit (or a few) could have the capability to effectively mitigate static electricity associated with an entire facility. Automated static control may not only improve compliance with safety standards, but may reduce maintenance costs associated with manual static elimination. This may not only improve productivity in the workplace, but may improve product reliability in various industries. For example, automated static control can reduce the likelihood of contamination in biosafety environments. Further, automated static control can reduce the likelihood of static induced component failure in electronic environments.

Turning now to the figures, FIG. 1 depicts a block diagram of an example computing environment 100 in which illustrative embodiments of the present disclosure may be implemented. In some embodiments, the computing environment 100 may include two sensors 102 and 112, two static units 106 and 116, and a computer system 122.

Consistent with various embodiments, the computer system 122 may include a processor 126 and memory 128. Similarly, static units 106 and 116 and/or sensors 102 and 112 may include processors or memory. The sensors 102 and 112, static units 106 and 116, and the computer system 122 may be configured to communicate with each other through an internal or external network interface 104, 114, 108, 118 and 124. The network interfaces 104, 114, 108, 118 and 124 may be, in some embodiments, modems or network interface cards. The sensors 102 and 112, static units 106 and 116, and/or the computer system 122 may be equipped with a display or monitor. Additionally, sensors 102 and 112, static units 106 and 116, and/or the computer system 122 may include optional input devices (e.g., a keyboard, mouse, scanner, or other input device), and/or any commercially available or custom software (e.g., browser software, communications software, server software, natural language processing software, search engine and/or web crawling software, filter modules for filtering content based upon predefined parameters, etc.). In some embodiments, the computer system 122 may be a server, desktop, laptop, or hand-held device.

The sensors 102 and 112, static units 106 and 116, and the computer system 122 may be distant from each other and communicate over a network 150. In some embodiments, the computer system 122 may be a central hub from which sensors 102 and 112 and static units 106 and 116 can establish a communication connection. Alternatively, the sensors 102 and 112, static units 106 and 116, and computer system 122 may be configured in any other suitable networking relationship (e.g., in a peer-to-peer (P2P) configuration or using any other network topology).

In some embodiments, the network 150 can be implemented using any number of any suitable communications media. For example, the network 150 may be a wide area network (WAN), a local area network (LAN), an internet, or an intranet. In certain embodiments, the sensors 102 and 112, static units 106 and 116, and the computer system 122 may be local to each other, and communicate via any appropriate local communication medium. For example, the sensors 102 and 112, static units 106 and 116, and the computer system 122 may communicate using a local area network (LAN), one or more hardwire connections, a wireless link or router, or an intranet. In some embodiments, the sensors 102 and 112, static units 106 and 116, and the computer system 122 may be communicatively coupled using a combination of one or more networks and/or one or more local connections. For example, the first sensor 102 may be hardwired to the computer system 122 (e.g., connected with an Ethernet cable) while the second sensor 112 may communicate with the computer system 122 using the network 150 (e.g., over the Internet).

In some embodiments, the network 150 may be implemented within a cloud computing environment, or using one or more cloud computing services. Consistent with various embodiments, a cloud computing environment may include a network-based, distributed data processing system that provides one or more cloud computing services. Further, a cloud computing environment may include many computers (e.g., hundreds or thousands of computers or more) disposed within one or more data centers and configured to share resources over the network 150.

The sensors 102 and 112 may be configured to collect static sensor data. The sensors 102 and 112 may monitor objects, surfaces, or air volumes to collect static sensor data over time. The static sensor data may then be analyzed (e.g., by computer system 122) to determine whether static condition exists (e.g., a condition in which static build-up is at an undesired level). In some embodiments, the sensors 102 and 112 may store static sensor data on memory, and thereafter may transfer the static sensor data to the computer system 122. In some embodiments, the sensors 102 and 112 may continually transmit static sensor data to the computer system 122. Static sensor data may be transmitted to the computer system 122 using any suitable technique, including push and pull techniques.

Any number of sensors 102 and 112 may be implemented. In some embodiments, the number of sensors may be based on volume requirements and/or the number of objects to be monitored. For example, a room with double the surface area may require double the number of sensors 102 and 112. In some embodiments, the number of sensors 102 and 112 may depend on the objects being monitored (e.g., a server may require multiple sensors, whereas a laptop computer may only require one sensor). In some embodiments, the number of sensors 102 and 112 may depend on safety standards (e.g. ISO cleanroom standards or ESDA published standards).

Sensors 102 and 112 may include any type of sensor configured to indicate electrostatic potential. For example, in some embodiments, sensors 102 and 112 may include static sensors designed for measuring voltages associated with electrostatic charge. These static sensors may include surface potential sensors for measuring the voltage on the surface of objects and/or human body static sensors for measuring static associated with humans. In some embodiments, sensors 102 and 112 may include humidity sensors, designed for measuring the relative humidity (RH) in the air. In some embodiments, sensors 102 and 112 may include an antenna to detect radio frequency (RF) noise associated with an ESD discharge taking place. In some embodiments, sensors 102 and 112 may include resistance to ground measurement to detect an out of range situation against the required resistance control points. In some embodiments, sensors 102 and 112 may include temperature sensors. In some embodiments, varying types of sensors may be integrated into a single sensor (e.g., a combined electrostatic/humidity sensor).

Sensors 102 and 112 may be disposed in any suitable location. In some embodiments, sensors 102 and 112 may be mobile, and may relocate as required. For example, in some embodiments, sensors 102 and 112 may track a user, and sense areas proximate to the user. In some embodiments, sensors 102 and 112 may be embedded in one or more objects. For example, sensors 102 and 112 may be embedded on a server. In some embodiments, sensors 102 and 112 may be evenly distributed based on sensing range requirements. For example, sensors 102 and 112 may be spaced equidistant from each other. In some embodiments, sensors 102 and 112 may be stationary. In these embodiments, the sensors 102 and 112 may be fixed in a specific location.

The number and placement of the sensors 102 and 112 may depend on the type of sensor. For example, in some embodiments, static sensors may have a smaller measurement range (e.g., within centimeters) than the measurement range of humidity sensors (e.g., within meters) for a given object. As such, in some embodiments, a greater number of static sensors may be implemented than humidity sensors. Further, in some embodiments, static sensors may be disposed more proximate to objects than humidity sensors.

Static sensor data may be collected in any suitable manner. In some embodiments, multiple sensors may be used to monitor the same object, and the multiple measurements may be combined (e.g., averaged) or considered separately. Further, static sensor data may include historical data, which may be combined into a single value (e.g., rate, acceleration, rolling average, etc.) Sampling rate (the rate at which measurements are obtained) for sensor measurements may vary. For example, the sampling rate for static sensor data may depend on the type of sensor, the rate of change of the static sensor data (e.g., historical static sensor data), and/or bandwidth considerations, to name a few.

After the set of static sensor data is received from sensors 102 and 112, the set of static sensor data may be analyzed by the computer system 122. The computer system 122 may, in some embodiments, analyze the set of static sensor data via a static analysis application 130. The static analysis application 130 may compare the set of static sensor data to a set of thresholds (e.g., static voltage thresholds, humidity thresholds, etc.). If the static analysis application 130 determines that the set of static sensor data does not satisfy (e.g., exceeds) the set of static thresholds, the static analysis application 130 may determine that a static condition exists. In response to determining that a static condition exists, the computer system 122 may issue one or more static actions (e.g., to be executed by static units 106 and 116).

In some embodiments, the static analysis application 130 may compile sensor data received from all objects and/or locations and generate a heat map of the static sensor data. The heat map may be a grid indicating intensity of measured values via color, texture, or other visual indicators. In some embodiments, the heat map may be used to determine whether a static condition exists. For example, if an object or location on the heat map is red (e.g., or any other color indicating a high static buildup), a static condition may be determined to exist in said object or location. In some embodiments, the heat map may then be output through a display device or graphical user interface.

A static condition may be determined in any suitable manner. For example, in some embodiments, the current value(s) of the static sensor data may be compared to a set of static thresholds, and a static condition may be determined to exist if the static sensor data does not satisfy the set of static thresholds. In some embodiments, the rate of change of the static sensor data may exceed a threshold, and a static condition may be determined to exist.

If the static analysis application 130 determines that a static condition exists, the computer system 122 may issue one or more static actions. The static actions may be issued to static units 106 and 116. The static action(s) issued may depend on the static sensor data analysis (e.g., comparison to static thresholds). For example, if a sensor embedded on a server indicates a static voltage value that exceeds a static threshold (e.g., 200V), then the computer system 122 may issue a static action to static unit(s) 106 and/or 116 to mitigate (e.g., neutralize) the static build-up associated with the server.

The static units 106 and 116 may execute one or more static actions as received by the computer system 122. The static units 106 and 116 may include static eliminators 109 and 119 to mitigate static build-up associated with surfaces and/or objects. In some embodiments, the static units 106 and 116 may be mobile static delivery systems. Mobility may allow static units 106 and 116 to respond to static actions as issued by the computer system 122, without requiring manual intervention. In some embodiments, static units 106 and 116 may be implemented in unmanned air vehicles (UAVs). The selected UAV may be multi-rotor (e.g., quad-copters), fixed-wing (e.g., planes), single-rotor (e.g., helicopters), or fixed-wing hybrid UAVs. In some embodiments, static units 106 and 116 may be land or water mobile units. In some embodiments, static units 106 and 116 may be mounted on a rail delivery system. However, it is noted that any other suitable mobile delivery system otherwise consistent herein is contemplated.

Static units 106 and 116 may include any type of static eliminator 109 and 119, respectively. The static eliminators 109 and 119 may be implemented to mitigate (e.g., treat or neutralize) static charge associated with objects or surfaces. Static eliminators 109 and 119 may include corona discharge ionizers, nuclear, and/or humidifiers, to name a few.

In some embodiments, static eliminators 109 and 119 may be corona discharge ionizers. Corona discharge ionizers operate by applying a high voltage to an electrode in close proximity to a grounded shield or casing. The voltage applied between the electrode and grounded shield or casing ionizes the air molecules in between the electrode and shield. Corona discharge ionizers may operate with alternating current (AC) or direct current (DC). AC corona discharge ionizers can generate positive ions during the first half-cycle of the waveform and negative ions during the second half-cycle of the waveform, or vice versa. This may provide thorough neutralization, as the positive ions may bind to negatively charged surfaces, and the negative ions may bind to positively charged surfaces. Alternatively, DC corona ionizers may be used. DC corona discharge ionizers can produce a single polarity ionization from each electrode integrated into the ionizer. Accordingly, DC ionizers may, in some embodiments, include positive and negative electrodes such that positive and negative ions are produced. Thereafter, the ionized air may be dissipated in any manner. For example, corona discharge ionizers can include blowers or overhead fans for dissipating ionized air to large volumes. Further, corona discharge ionizers can include ionizing air guns for targeted static neutralization. Likewise, mobile delivery systems including, for example, UAV rotors or fans, may be used as a part of the ionized air delivery system.

In some embodiments, static eliminators 109 and 119 can include nuclear ionization. Nuclear ionization neutralize static electricity through the use of polonium 210. Specifically, polonium 210 emits alpha particles which include positively charged helium nuclei (two protons, two neutrons, and no electrons). When the alpha particle collides with molecules in the air, they displace electrons from some air molecules creating positive air ions. These free electrons are eventually captured by other air molecules creating negative ions.

In some embodiments, static eliminators 109 and 119 can include humidifiers. Humidification can be an effective way to eliminate static build-up. By increasing relative humidity with a humidifier, the air can be brought to a humidity level such that the air acts as a natural conductor, allowing charges to release into the air.

Any number of static units 106 and 116 may be implemented. In some embodiments the number of static units 106 and 116 may depend on the volume to be treated and/or the number of objects to be treated. In some embodiments, the number of static units 106 and 116 may be commensurate with the number of sensors 102 and 112. In some embodiments, there may be a single static unit, which may be sufficient to treat an entire volume (e.g., an ionizing blower mounted on a quad-copter). In some embodiments, a single static unit may have multiple static eliminators. For example, static unit 106 may include a static eliminator 109 with a humidifier and a corona discharge ionizer.

Static units 106 and 116 may be placed in any suitable location. In some embodiments, static units 106 and 116 may be centrally located in a facility, to minimize the time required to deploy each static unit to a treatment area. In some embodiments, static units 106 and 116 may each correspond to a given location (e.g., a room, a warehouse, etc.). In some embodiments, static units 106 and 116 may correspond to sensors or sets of sensors. For example, in some embodiments, static unit 106 may correspond to sensor 102, and static unit 116 may correspond to sensor 112.

In some embodiments, static units 106 and 116 may include memory. The static units 106 and 116 may store actions issued by the computer system 122 in the memory. In some embodiments, the static units 106 and 116 may build a queue of actions to be issued. In these embodiments, the static units 106 and 116 may complete current static actions, then move onto the next static actions in the queue until all static actions are executed.

In some embodiments, static actions may be prioritized. In these embodiments, static units 106 and 116 or computer system 122 may be configured to prioritize between multiple simultaneous pending static actions to be executed. For example, static units 106 and 116 or computer system 122 may be configured to prioritize static actions based on proximity. In some embodiments, static actions may be prioritized based on importance. For example, if there is only a single static unit, and multiple static conditions, the most important static conditions may be treated first. In this example, if a server containing critical data breaches a static threshold, and a user-laptop also breaches a static threshold, the single static unit may first treat the server containing critical data. Likewise, static actions may be prioritized based on severity. For example, if two servers breach a static threshold, but one server has a static potential of 1000V, and the other server has a static potential of 500V, the server with a static potential of 1000V may be treated first. In some embodiments, static units 106 and 116 may execute static actions based on user activity. For example, static units 106 and 116 may track a user while working, and treat static conditions surrounding the user.

In some embodiments, actions may be issued based on measurements received by sensors 102 and 112. For example, if sensors 102 and 112 indicate a low relative humidity in a location, then static units 106 and 116 may execute static actions to increase the humidity of the low humidity location (e.g., via humidifiers included in static eliminators 109 and 119). Likewise, if sensors 102 and 112 indicate a high static potential on an object, static units 106 and 116 may execute a static action to decrease the static potential on the object (e.g., via ionizers or humidifiers). In some embodiments, multi-static actions may be issued. For example, if sensors 102 and 112 indicate a low relative humidity and a high electric potential on an object, then static units 106 and 116 may simultaneously ionize and humidify the target object. In some embodiments, static unit 106 may include a humidifier, and static unit 116 may include an ionizer, or vice versa. Similarly, static units 106 and 116 may each include both a humidifier and ionizer.

It is noted that FIG. 1 is intended to depict the representative major components of an exemplary computing environment 100. In some embodiments, however, individual components may have greater or lesser complexity than as represented in FIG. 1, components other than or in addition to those shown in FIG. 1 may be present, and the number, type, and configuration of such components may vary. For example, in some embodiments, sensors 102 and 112 and static units 106 and 116 may each include memory and processors. Further, in some embodiments, more than two sensors and/or more than two static units may be implemented.

Figure 2:
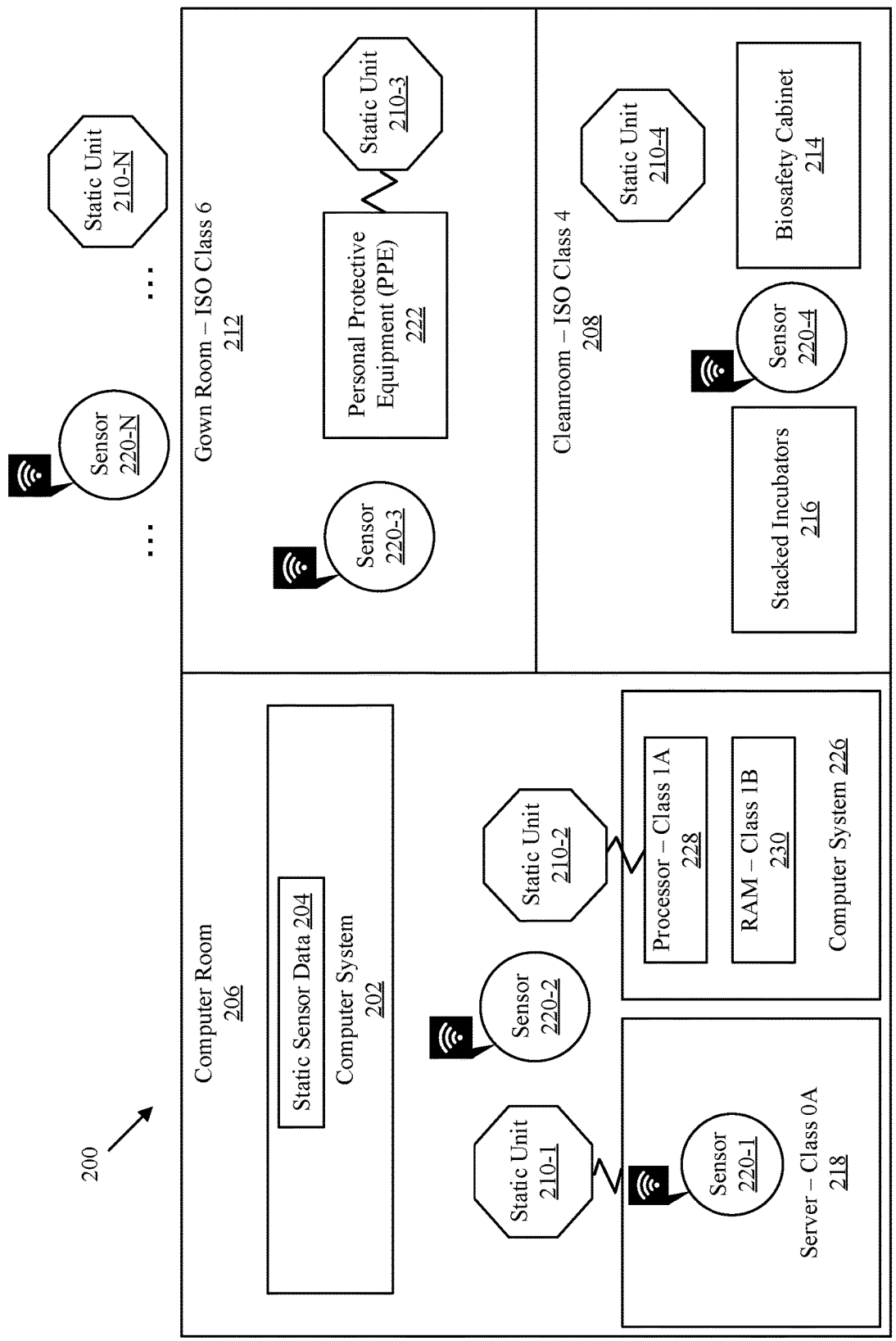
FIG. 2 is a block diagram illustrating an example static control environment, in accordance with embodiments of the present disclosure.

FIG. 2 is a block diagram illustrating an example static control environment, in accordance with embodiments of the present disclosure. Static control environment 200 may model an example industrial environment in which embodiments of the present disclosure may be implemented. In some embodiments, the industrial environment may include multiple rooms. For example, static control environment 200 may include a computer room 206, a clean room 208, and a gown room 212. Each room included in the static control environment 200 may be individually controlled (e.g., based on static standards and static thresholds).

Sensors 220-1, 220-2, 220-3, and 220-4 (herein collectively referred to as sensors 220) may be disposed throughout the static control environment 200. Further, sensors 220 may include any additional number of sensors 200-N, which may be disposed within static control environment 200 or in any other location (e.g., remotely located). The sensors may be configured to communicate with computer system 202 through a network (e.g., network 150 in FIG. 1). The sensors 220 may transmit static sensor data 204 to the computer system 202, and the computer system 202 may store the static sensor data 204 in memory. The computer system 202 may be configured to analyze the static sensor data 204. In some embodiments, the computer system 202 may compare the static sensor data 204 to one or more static thresholds to determine whether a static condition exists. In response to determining that a static condition exists, the computer system 202 may be configured to issue one or more static actions to static units 210-1, 210-2, 210-3, and/or 210-4 (herein collectively referred to as static units 210).

Sensors 220 may include a variety of different sensor types. In example static control environment 200, sensors 220-1 and 220-3 may be electrostatic sensors, sensor 200-2 may be a hybrid electrostatic/humidity sensor, and sensor 200-4 may be a humidity sensor. However, addition sensor types may also be included (e.g., temperature sensors). Further, any additional number of sensors may be included.

Sensors 220 may be placed in any suitable location. For example, sensor 220-1 may be embedded on server 218, and may continually monitor electrostatic potential associated with server 218. Sensor 220-2 may be centrally located in the computer room 206, to monitor the RH and electrostatic potential within the computer room 206. Sensor 220-3 may be disposed adjacent to personal protective equipment (PPE) 222, to monitor electrostatic potential associated with the PPE 222. Sensor 200-4 may be disposed between stacked incubators 216 and biosafety cabinet 214, to monitor the relative humidity of air within clean room 208.

Computer system 202 may be configured to analyze static sensor data 204 received by the sensors 220. Alternatively, sensors 220 and/or static units 210 (e.g., static unit 210-1, 210-2, 210-3, 210-4, 210-N) may be configured to analyze static sensor data (e.g., by including one or more processors). Analysis may include comparing the static sensor data 204 to one or more thresholds. Static thresholds may depend on specific objects and/or locations being monitored.

For example, computer room 206 may be controlled in accordance with ESD standards as defined by the Electrostatic Discharge Association (ESDA) and Joint Electron Device Engineering Council (JEDEC). These standards may include static thresholds for components and microcircuits according to their susceptibility to damage or degradation by exposure to a defined human body model (HBM) ESD. HBM ESD standards include Class 0A (<125 V), Class 0B (125V-250V), Class 1A (250V-500V), Class 1B (500V-1000V), Class 1C (1000V-2000V), Class 2 (2000V-4000V), Class 3A (4000V-8000V) and Class 3B (>8000V) components. In some embodiments, entire systems may be given a single ESD classification (e.g., server 218 may have a single classification). In some embodiments, individual components may be respectively classified (e.g., processor 228 and RAM 230 may have their own respective classifications).

As depicted in FIG. 2, server 218 may be classified as a Class 0A component under HMB ESD standards with a static threshold upper limit of 125V. Accordingly, if the computer system 202 receives a value from sensor 220-1 greater than or equal to 125V, a static condition may be determined to exist. In this example, the computer may receive a static potential reading of 200V from sensor 200-1. Accordingly, computer system 202 may issue a static action in response to determining the static condition exists. The static action may be received by static unit 210-1, which includes a corona discharge ionizer. The static unit 210-1 may then mitigate the static associated with the server 218, such that the electric potential falls below 125V (e.g., as indicated by the zig-zag line emitted from static unit 210-1). Sensor 220-1 may continually monitor the electrostatic potential associated with server 218 thereafter, to ensure the electrostatic potential remains below 125V (e.g., through a control feedback loop).

Computer system 226 may include individual components with different sensitivities to electrostatic potential. For example, processor 228 of computer system 226 may be classified as a Class 1A component with a static threshold upper limit of 500V and RAM 230 of computer system 226 may be classified as a Class 1B component with a static threshold upper limit of 1000V. Accordingly, if the computer system 202 receives an electrostatic potential over 500V for processor 228, or over 1000V for RAM 230, a static condition may be determined to exist. In this example, the computer may receive a static potential reading of 750V from sensor 220-2 corresponding to computer system 226. Accordingly, the computer system 202 may issue a static action to the processor 228, for exceeding the static threshold upper limit of 500V. The static action may be received by static unit 210-2, which may include a photoionizer static eliminator. Static unit 210-2 may then emit soft X-rays to mitigate the charge associated with processor 228 (e.g., as indicated by the zig-zag line emitted from static unit 210-2), such that the static potential drops below 500V.

Additionally, computer room 206 may include a humidity threshold, to reduce static build-up. In this example, computer room 206 may have a humidity threshold lower limit of 45% RH. Accordingly, if computer system 202 receives a relative humidity percentage below 45%, a static unit with a humidifier may be deployed to increase the relative humidity. However, in this example, the humidity may be at 50% RH as reported by sensor 220-2. Accordingly, the computer system 202 may not identify that a static condition exists associated with the humidity data.

The cleanroom 208 and gown room 212 may be controlled based on ISO cleanroom standards. ISO cleanroom classifications are rated according to how many particulates of specific sizes are permitted per cubic meter. For example, ISO class 4 may allow 83 particulates with a 1 micron diameter per cubic meter. Conversely, ISO class 6 may allow 8,320 particulates with a 1 micron diameter per cubic meter. Static standards may be closely tied to clean room standards, as charged objects or surfaces tend to attract particulates. Accordingly, ISO class 4 cleanroom 208 may require stringent static control compared to ISO class 6 gown room 212. However, because components from gown room 212 may enter ISO class 4 cleanroom 208, components within gown room 212 may be controlled as if they were ISO class 4.

Gown room 212 may be monitored to reduce static build-up such that particulates are prevented from adhering onto objects before entering cleanroom 208. Specifically, PPE 222 in gown room 212 may be monitored by sensor 220-3, to ensure electrostatic levels remain low enough to prevent particulates from binding to PPE 222 such as gowns, glasses, goggles, gloves, shoe covers, etc. Computer system 202 may set a static threshold of 50V for PPE 222. Accordingly, if computer system 202 receives a static potential value higher than 50V from static sensor 220-3 associated with PPE 222, the computer system 202 may indicate that a static condition exists. In this example, static sensor 220-3 reports a static potential value of 80V. Computer system 202 may then indicate that a static condition exists, as the measured static potential value received by sensor 220-3 exceeds the static threshold of 50V. Accordingly, computer system 202 may issue a static action to static units 210. Static unit 210-3 may be selected to execute the static action (e.g., based on proximity to the static condition), and may be configured to mitigate the static charge. Specifically, static unit 210-3 may include a corona discharge ionizer with a blower fan to mitigate static associated with the PPE 222. The PPE 222 may then be mitigated by static unit 210-3 such that the static potential drops below the static threshold, preventing particulates from binding to PPE 222 prior to entering cleanroom 208.

Sensor 220-4 may monitor the RH of the cleanroom 208. Computer system 202 may set a lower limit of 60% RH, to prevent static build-up in clean room 208. In some embodiments, humidity percentage may be set higher if corrosion is not an issue in the environment. For example, a higher RH may be permitted in cleanroom 208 if there are not electronics prone to corrosion damage (e.g., from air moisture). If computer system 202 receives an RH below 60% from sensor 220-4, then the computer system 202 may indicate that a static condition exists. In this example, computer system 202 receives an RH of 53% from sensor 220-4. Accordingly, computer system 202 may indicate that a static condition exists, and may issue a static action. Static unit 210-4 may be selected (e.g., based on proximity and the type of static unit) to execute the static action. Static unit 210-4, may then humidify cleanroom 208 until the RH is above 60% (e.g., as indicated by the sensor 220-4).

It should be noted, that though static units 210 may correspond to respective sensors 220 in example static control environment 200, in some embodiments, static units 210 may correspond to a set of sensors 220, or sensors 220 may correspond to a set of static units 210. For example, in some embodiments, there may only be a single static unit 210-1, which may execute static actions corresponding to sensor data obtained from each static sensor 220. In some embodiments, static units 210 may be centrally located in a deployment room, and may treat static conditions based on proximity, importance, and/or the static condition reported (e.g., a humidifier static unit may be deployed to treat a humidity static condition). Further, though example static control environment 200 depicts four sensors and four static units, any number of static sensors 220-N and/or static units 210-N may be implemented.

In some embodiments, issuing static control actions may be based on PID control. In other words, computer system 202 may not only consider the most recent static sensor data, but previously obtained static sensor data to determine an appropriate static control action. For example, static potential adjustments may be based on present error (e.g., a proportional component), past errors (e.g., an integral component), and the current rate of change (e.g., a derivative component). Each component may also be weighted using weighting factors set by a user or determined automatically by the computer system 202 using historical static sensor data 204. In some embodiments, the computer system 202 may alter the weighting factors dynamically (e.g., during a testing period). For example, the processor may determine that the error (e.g., between the sought static potential and the measured static potential) is increasing, or that the error is not decreasing at a fast enough rate, and may adjust the weighting factors of one or more of the proportional, derivative, and/or integral components automatically. Any suitable combination of proportional, integral, and derivative adjustments may be administered. In some embodiments, the computer system 202 may only include proportional and integral action (e.g., PI control). In some embodiments, only one of proportional, integral, or derivative control may be issued.

It is noted that FIG. 2 is intended to depict the representative major components of an exemplary static control environment 200. In some embodiments, however, individual components may have greater or lesser complexity than as represented in FIG. 2, components other than or in addition to those shown in FIG. 2 may be present, and the number, type, and configuration of such components may vary. For example, in some embodiments, sensors 220 may each include a temperature sensor. In some embodiments, each static unit 210 may include a mobile delivery system for administering each static action. In some embodiments, there may be a greater or lesser number of sensors 220 and/or static units 210.

Figure 3:
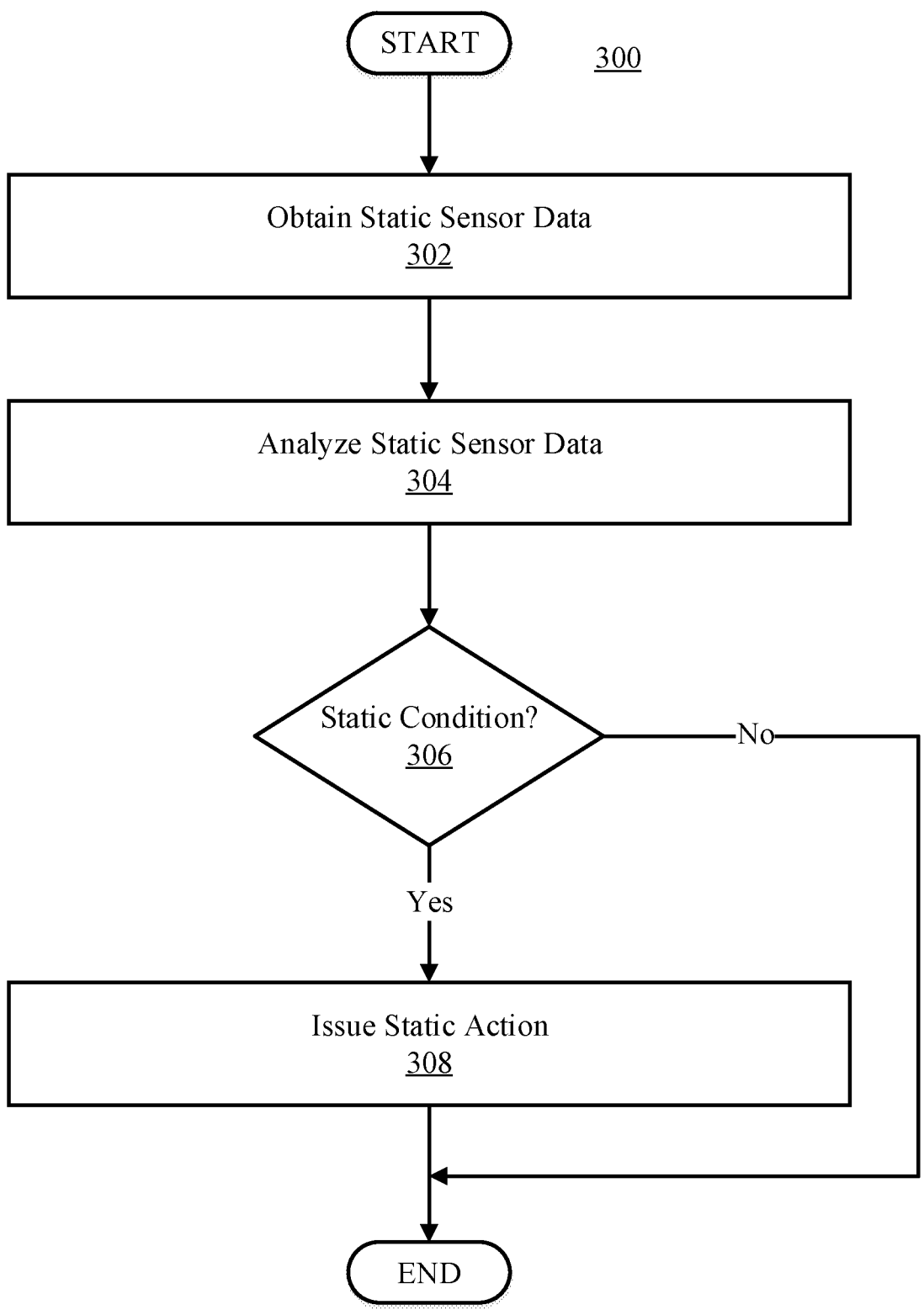
FIG. 3 is a flow diagram illustrating an example static control method, in accordance with embodiments of the present disclosure.

FIG. 3 is a flow diagram illustrating an example static control method, in accordance with embodiments of the present disclosure. Example method 300 may be performed by a processor. In some embodiments, one or more operations of method 300 may be performed by a user, or by the processor in response to user input.

Static control method 300 may start at operation 302, where static sensor data may be obtained. Static sensor data may be collected by one or more sensors (e.g., sensors 102 and 112 from FIG. 1 or sensors 220 from FIG. 2). The sensors may collect data associated with static build-up, including static potential (e.g., voltage), relative humidity, and/or temperature. The sensors may compile static sensor data on memory located on each sensor, or may continually transmit static sensor data over a network to one or more computer systems. The static sensor data may be received by a computer system (e.g., computer system 122 of FIG. 1 or computer system 202 of FIG. 2).

The computer system may receive static sensor data in any manner. In some embodiments, static sensor data is received over a network (e.g., network 150 from FIG. 1). Static sensor data can be received as requested by the computer system (e.g., using push techniques). Alternatively, static sensor data can be transmitted to the computer system as initiated by the one or more sensors (e.g., using pull/get techniques). Static sensor data may then be stored in memory on the computer system.

After static sensor data is obtained at operation 302, the static sensor data may be analyzed at operation 304. In some embodiments, analysis may include comparing the static sensor data to one or more thresholds (e.g., based on static thresholds or safety standards). In some embodiments, analyzing the static sensor data may include analyzing the history of the static sensor data, which may include rates, averages, or other statistical parameters. In some embodiments, analyzing static sensor data may include generating a heat map of the static sensor data through a sensor grid (e.g., a plurality of sensors disposed throughout an area). In some embodiments, a processor located in a computer system, a sensor, and/or a static unit (e.g., static unit 210 from FIG. 2) may analyze the static sensor data.

At operation 306, a processor (e.g., of a computer system, sensor, or static unit) may determine whether a static condition exists based on the analysis performed in operation 304. In some embodiments, determining that a static condition exists may be based on one or more static thresholds. If the static sensor data does not satisfy the set of static thresholds, a static condition may be determined to exist. For example, if a static threshold is set with an upper limit of 1000V, and a processor analyzing the static sensor data receives a static potential value of 1,500V, a static condition may be determined to exist. Similarly, if a static potential acceleration threshold is set with an upper limit of $+5V/s^2$, and a processor analyzing the static sensor data receives a static potential acceleration of $+20V/s^2$, a static condition may be determined to exist.

Conversely, if the static sensor data satisfies the set of static thresholds, a static condition may be determined to not exist. For example, if a static threshold is set with an upper limit of 500V, and a processor analyzing the static sensor data receives a static potential value of 400V, a static condition may be determined to not exist.

In some embodiments, a static condition may be determined to exist based on a heat map. In these embodiments if a color, texture, or other visual indicator of the heat map exceeds a threshold, a static condition may be determined to exist. Any additional suitable data visualization technique can be included to determine a static condition (e.g., or otherwise provide condition/prediction capability). For example, additional data visualization techniques include bar graphs, scatter plots, trend charts, pie charts, tables, etc.

If a static condition is determined to exist at operation 306, method 300 may proceed to operation 308, where a static action may be issued based. If a static condition is determined to not exist at operation 306, method 300 may end.

In some embodiments, in response to a determination that a static condition exists, a set of mobile static unit data may be obtained. The mobile static unit data may include various details relating to the mobile static units, including their current location, power, type of static eliminator, and type of delivery system. The mobile static unit data may then be analyzed to determine the appropriate mobile static unit for selection. For example, in some embodiments, mobile static units may be selected based on their proximity to the static condition. In some embodiments, mobile static units may be selected based on their current power level (e.g., a static unit with sufficient power may be selected). In some embodiments, the type of static eliminator included in the mobile static unit may be considered when making a mobile static unit selection. In some embodiments, the type of mobile delivery system may dictate the type of mobile static unit selected (e.g., rail delivery static units vs. UAV static units). In some embodiments, multiple factors may be considered when making a mobile static unit selection (e.g., the type of static eliminator, power, and location may all be considered when selecting the mobile static unit).

At operation 308 a static action may be issued. Static actions may be issued to neutralize and/or reduce (e.g., mitigate) static build-up associated with objects or surfaces. Example static actions include ionization and humidification. In some embodiments, a computer system may issue static actions to static units including static eliminators (e.g., static eliminators 109 and 119 from FIG. 1). Static actions can be issued to static units through a network, or through any other suitable communication method.

In some embodiments, static units may include a mobile delivery system, to neutralize objects or locations associated with the static condition. This may allow the static units to autonomously mitigate static conditions. Mobile delivery systems can include UAVs, land or water mobile systems, and rail delivery systems, to name a few. In response to receiving a static action, the static units may be deployed to the target area associated with the static condition.

In some embodiments, the static action issued at operation 308 may depend on the static sensor data. For example, if a humidity value of the static sensor data does not satisfy a humidity threshold, then a static unit with a humidifier may be deployed to treat (e.g., humidify) the object/location associated with the static condition. Alternatively, if a static potential value of the static sensor data does not satisfy a static potential threshold, then a static unit with an ionizer may be deployed to treat (e.g., mitigate or neutralize) the object/location associated with the static condition. However, in some embodiments, an ionizing unit may be deployed in response to a humidity value not satisfying a humidity threshold. Similarly, in some embodiments, a humidifying unit may be deployed in response to an electrostatic potential value exceeding an electrostatic potential threshold.

Static units may, in some embodiments, standby the location associated with the static condition after the static action is executed. This may be implemented to allow the sensors to report static sensor data to the computer system after the static action is executed. If the static sensor data indicates that the static condition still exists, the static unit may mitigate the static condition without requiring relocation. After the static actions are executed, method 300 may end.

The aforementioned operations may be completed in any order and are not limited to those described. Additionally, some, all, or none of the aforementioned operations may be completed, while still remaining within the spirit and scope of the present disclosure. For example, in some embodiments, operations 304 and 306 may not be completed, and a static action may be issued based on the static sensor data regardless of whether a static condition exists. That is, in some embodiments, static sensor data may be obtained at operation 302, and static actions may be issued at operation 308 without analyzing or otherwise processing the static sensor data 302.

It is to be understood that although this disclosure includes a detailed description on cloud computing, implementation of the teachings recited herein are not limited to a cloud computing environment. Rather, embodiments of the present disclosure are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported, providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure that includes a network of interconnected nodes.

Figure 4:
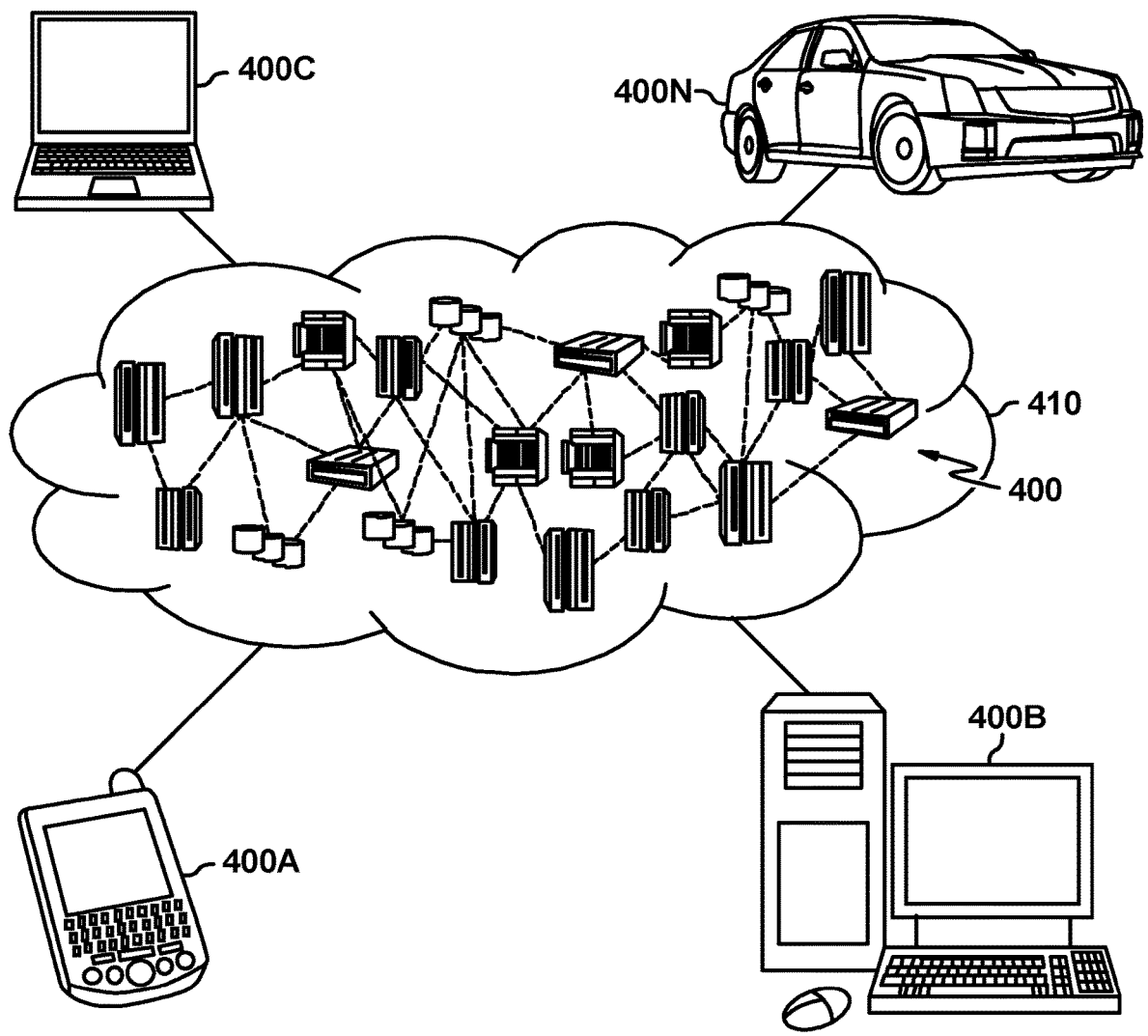
FIG. 4 is a diagram illustrating a cloud computing environment, in accordance with embodiments of the present disclosure.

Referring now to FIG. 4, illustrative cloud computing environment 410 is depicted. As shown, cloud computing environment 410 includes one or more cloud computing nodes 400 with which local computing devices used by cloud consumers, such as, for example, personal digital assistant (PDA) or cellular telephone 400A, desktop computer 400B (e.g., computer system 122, computer system 202, server 212, computer system 226) laptop computer 400C (e.g., computer system 122, computer system 202, server 212, computer system 226), and/or automobile computer system 400N may communicate. Nodes 400 may communicate with one another. They may be grouped (not shown) physically or virtually, in one or more networks, such as Private, Community, Public, or Hybrid clouds as described hereinabove, or a combination thereof. This allows cloud computing environment 410 to offer infrastructure, platforms and/or software as services for which a cloud consumer does not need to maintain resources on a local computing device. It is understood that the types of computing devices 400A-N shown in FIG. 4 are intended to be illustrative only and that computing nodes 400 and cloud computing environment 410 can communicate with any type of computerized device over any type of network and/or network addressable connection (e.g., using a web browser).

Figure 5:
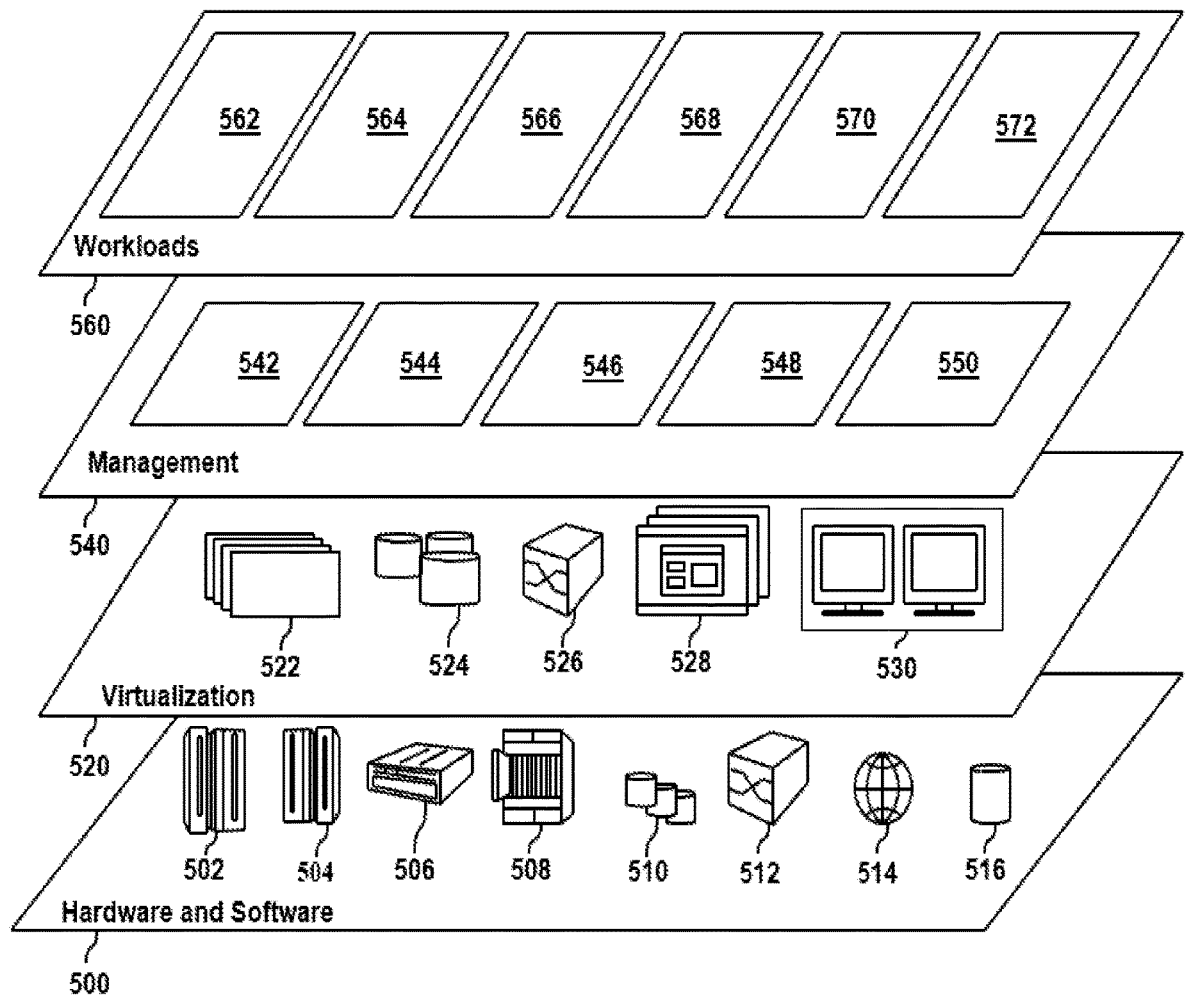
FIG. 5 is a block diagram illustrating abstraction model layers, in accordance with embodiments of the present disclosure.

Referring now to FIG. 5, a set of functional abstraction layers provided by cloud computing environment 410 (FIG. 4) is shown. It should be understood in advance that the components, layers, and functions shown in FIG. 5 are intended to be illustrative only and embodiments of the disclosure are not limited thereto. As depicted below, the following layers and corresponding functions are provided.

Hardware and software layer 500 includes hardware and software components. Examples of hardware components include: mainframes 502; RISC (Reduced Instruction Set Computer) architecture based servers 504; servers 506; blade servers 508; storage devices 510; and networks and networking components 512. In some embodiments, software components include network application server software 514 and database software 516.

Virtualization layer 520 provides an abstraction layer from which the following examples of virtual entities may be provided: virtual servers 522; virtual storage 524; virtual networks 526, including virtual private networks; virtual applications and operating systems 528; and virtual clients 530.

In one example, management layer 540 may provide the functions described below. Resource provisioning 542 provides dynamic procurement of computing resources and other resources that are utilized to perform tasks within the cloud computing environment. For example, resource provisioning 542 may obtain a suitable number of processing devices to process static sensor data. Metering and Pricing 544 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 546 provides access to the cloud computing environment for consumers and system administrators. Service level management 548 provides cloud computing resource allocation and management such that required service levels are met. Service level management 548 may allocate suitable processing power and memory to process static sensor data. Service Level Agreement (SLA) planning and fulfillment 550 provide pre-arrangement for, and procurement of, cloud computing resources for which a future requirement is anticipated in accordance with an SLA.

Workloads layer 560 provides examples of functionality for which the cloud computing environment may be utilized. Examples of workloads and functions which may be provided from this layer include: mapping and navigation 562; software development and lifecycle management 564; virtual classroom education delivery 566; data analytics processing 568; transaction processing 570; and identifying an identifiable media 572.

Figure 6:
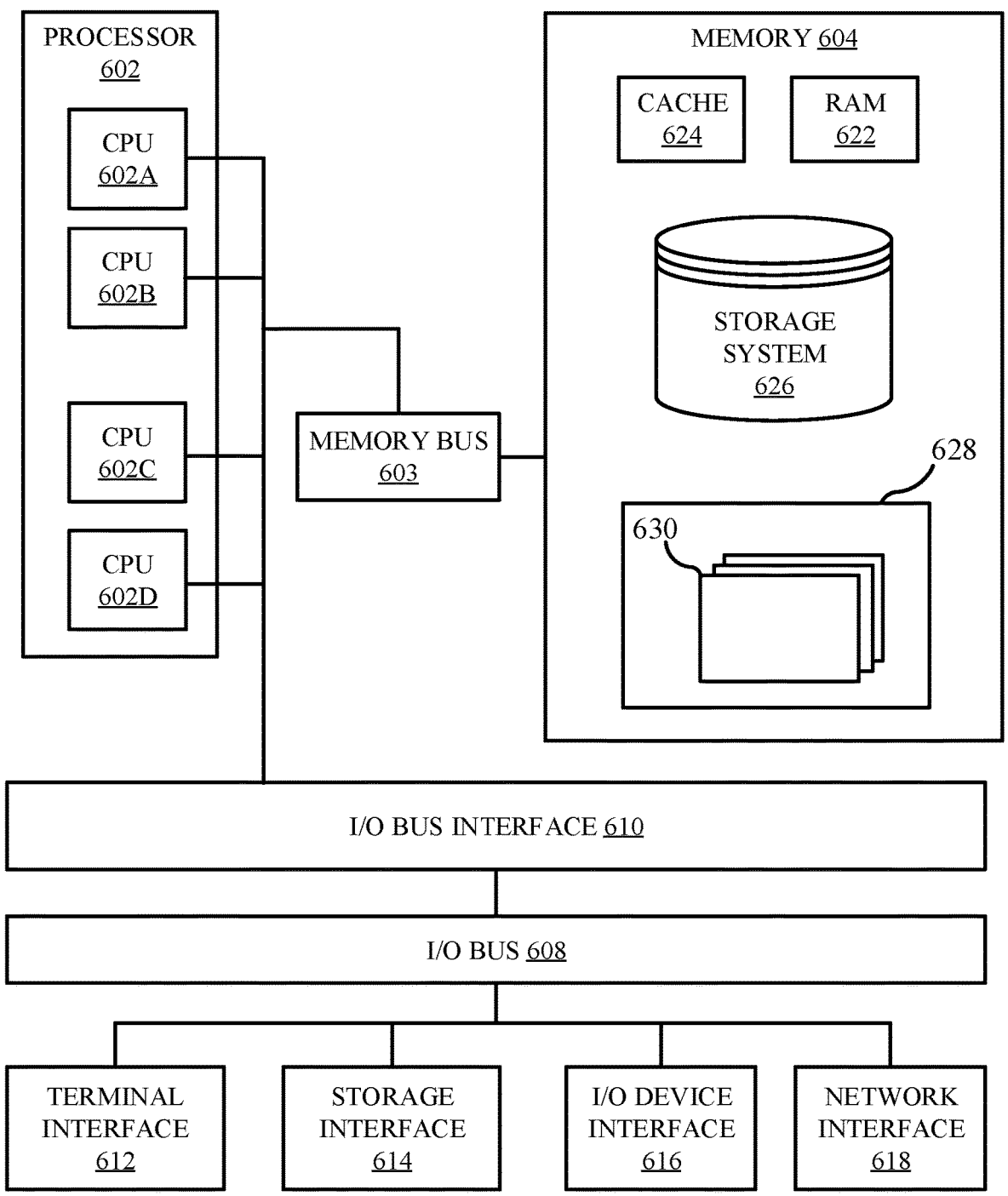
FIG. 6 is a high-level block diagram illustrating an example computer system that may be used in implementing one or more of the methods, tools, and modules, and any related functions, described herein, in accordance with embodiments of the present disclosure.

Referring now to FIG. 6, shown is a high-level block diagram of an example computer system 601 (e.g., computer system 122, computer system 202, server 212, computer system 226) that may be used in implementing one or more of the methods, tools, and modules, and any related functions, described herein (e.g., using one or more processor circuits or computer processors of the computer), in accordance with embodiments of the present disclosure. In some embodiments, the major components of the computer system 601 may comprise one or more CPUs 602, a memory subsystem 604, a terminal interface 612, a storage interface 616, an I/O (Input/Output) device interface 614, and a network interface 618, all of which may be communicatively coupled, directly or indirectly, for inter-component communication via a memory bus 603, an I/O bus 608, and an I/O bus interface unit 610.

The computer system 601 may contain one or more general-purpose programmable central processing units (CPUs) 602A, 602B, 602C, and 602D, herein generically referred to as the CPU 602. In some embodiments, the computer system 601 may contain multiple processors typical of a relatively large system; however, in other embodiments the computer system 601 may alternatively be a single CPU system. Each CPU 602 may execute instructions stored in the memory subsystem 604 and may include one or more levels of on-board cache.

System memory 604 may include computer system readable media in the form of volatile memory, such as random access memory (RAM) 622 or cache memory 624. Computer system 601 may further include other removable/non-removable, volatile/non-volatile computer system storage media. By way of example only, storage system 626 can be provided for reading from and writing to a non-removable, non-volatile magnetic media, such as a "hard-drive." Although not shown, a magnetic disk drive for reading from and writing to a removable, non-volatile magnetic disk (e.g., a "floppy disk"), or an optical disk drive for reading from or writing to a removable, non-volatile optical disc such as a CD-ROM, DVD-ROM or other optical media can be provided. In addition, memory 604 can include flash memory, e.g., a flash memory stick drive or a flash drive. Memory devices can be connected to memory bus 603 by one or more data media interfaces. The memory 604 may include at least one program product having a set (e.g., at least one) of program modules that are configured to carry out the functions of various embodiments.

One or more programs/utilities 628, each having at least one set of program modules 630 may be stored in memory 604. The programs/utilities 628 may include a hypervisor (also referred to as a virtual machine monitor), one or more operating systems, one or more application programs, other program modules, and program data. Each of the operating systems, one or more application programs, other program modules, and program data or some combination thereof, may include an implementation of a networking environment. Programs 628 and/or program modules 630 generally perform the functions or methodologies of various embodiments.

In some embodiments, the program modules 630 of the computer system 601 may include a static sensor data analysis module. The static sensor analysis module may include computer instructions to obtain static sensor data and process the static sensor data thereafter. This may include setting one or more static thresholds, and comparing the static sensor data to the one or more static thresholds to determine whether a static condition exists. Static sensor data analysis module may also be configured to issue static actions based on static conditions. In some embodiments, static sensor data analysis module may be configured to allocate static actions to specific static treatment units (e.g., based on priority or importance).

Although the memory bus 603 is shown in FIG. 6 as a single bus structure providing a direct communication path among the CPUs 602, the memory subsystem 604, and the I/O bus interface 610, the memory bus 603 may, in some embodiments, include multiple different buses or communication paths, which may be arranged in any of various forms, such as point-to-point links in hierarchical, star or web configurations, multiple hierarchical buses, parallel and redundant paths, or any other appropriate type of configuration. Furthermore, while the I/O bus interface 610 and the I/O bus 608 are shown as single respective units, the computer system 601 may, in some embodiments, contain multiple I/O bus interface units 610, multiple I/O buses 608, or both. Further, while multiple I/O interface units are shown, which separate the I/O bus 608 from various communications paths running to the various I/O devices, in other embodiments some or all of the I/O devices may be connected directly to one or more system I/O buses.

In some embodiments, the computer system 601 may be a multi-user mainframe computer system, a single-user system, or a server computer or similar device that has little or no direct user interface, but receives requests from other computer systems (clients). Further, in some embodiments, the computer system 601 may be implemented as a desktop computer, portable computer, laptop or notebook computer, tablet computer, pocket computer, telephone, smart phone, network switches or routers, or any other appropriate type of electronic device.

It is noted that FIG. 6 is intended to depict the representative major components of an exemplary computer system 601. In some embodiments, however, individual components may have greater or lesser complexity than as represented in FIG. 6, components other than or in addition to those shown in FIG. 6 may be present, and the number, type, and configuration of such components may vary.

As discussed in more detail herein, it is contemplated that some or all of the operations of some of the embodiments of methods described herein may be performed in alternative orders or may not be performed at all; furthermore, multiple operations may occur at the same time or as an internal part of a larger process.

The present disclosure may be a system, a method, and/or a computer program product. The computer program product may include a computer readable storage medium (or media) having computer readable program instructions thereon for causing a processor to carry out aspects of the present disclosure.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers, and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The data regarding the static conditions can be stored in a data base which includes the various conditions (e.g., humidity, static electricity, temperature, etc.) and can be coupled with temporal and location data. Various operational information can also be stored, such as the parts being built at specific locations, the number of workers, worker ID numbers, as well as the number of ESD damaged parts. The data can be analyzed to improve the actions to be taken in the future. The analysis can also be coupled with an automated machine learning system to determine the actions. For example, the analysis and control method can include machine learning methods such as supervised learning, clustering, structured prediction, anomaly detection, neural networks, reinforcement learning, Markov Decision Processes (MDP), etc.

The terminology used herein is for the purpose of describing particular embodiments only and is not intended to be limiting of the various embodiments. As used herein, the singular forms "a," "an," and "the" are intended to include the plural forms as well, unless the context clearly indicates otherwise. It will be further understood that the terms "includes" and/or "including," when used in this specification, specify the presence of the stated features, integers, steps, operations, elements, and/or components, but do not preclude the presence or addition of one or more other features, integers, steps, operations, elements, components, and/or groups thereof. In the previous detailed description of example embodiments of the various embodiments, reference was made to the accompanying drawings (where like numbers represent like elements), which form a part hereof, and in which is shown by way of illustration specific example embodiments in which the various embodiments may be practiced. These embodiments were described in sufficient detail to enable those skilled in the art to practice the embodiments, but other embodiments may be used and logical, mechanical, electrical, and other changes may be made without departing from the scope of the various embodiments. In the previous description, numerous specific details were set forth to provide a thorough understanding the various embodiments. But, the various embodiments may be practiced without these specific details. In other instances, well-known circuits, structures, and techniques have not been shown in detail in order not to obscure embodiments.

Different instances of the word "embodiment" as used within this specification do not necessarily refer to the same embodiment, but they may. Any data and data structures illustrated or described herein are examples only, and in other embodiments, different amounts of data, types of data, fields, numbers and types of fields, field names, numbers and types of rows, records, entries, or organizations of data may be used. In addition, any data may be combined with logic, so that a separate data structure may not be necessary. The previous detailed description is, therefore, not to be taken in a limiting sense.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Although the present disclosure has been described in terms of specific embodiments, it is anticipated that alterations and modification thereof will become apparent to the skilled in the art. Therefore, it is intended that the following claims be interpreted as covering all such alterations and modifications as fall within the true spirit and scope of the disclosure.

What is claimed is:

1. A system for dynamically controlling static electricity, the system comprising:
   two or more static sensors configured to obtain a set of static sensor data by sampling static indicators associated with at least one target location;
   one or more mobile static units configured to mitigate static; and
   a processor and memory communicatively coupled to the two or more static sensors and the one or more mobile static units, wherein the processor is configured to perform a method comprising:
      obtaining the set of static sensor data from the two or more static sensors;
      analyzing the set of static sensor data;
      determining, based on the analysis of the set of static sensor data, that a static condition exists;
      obtaining, in response to determining that a static condition exists, a set of mobile static unit data from the one or more mobile static units;
      analyzing the set of mobile static unit data;
      selecting, based on the analysis of the mobile static unit data, a mobile static unit of the one or more mobile static units;
      transmitting an action to mitigate the static condition to the selected mobile static unit; and
      deploying the selected mobile static unit to mitigate the static condition.

2. The system of claim 1, wherein analyzing the set of static sensor data further comprises generating a heat map of the static sensor data.

3. The system of claim 1, wherein the set of static sensor data includes a set of static electricity potential data, wherein analyzing the set of static sensor data includes comparing the set of static electricity potential data to a set of static electricity potential thresholds, wherein the static condition is determined to exist if the set of static electricity potential data does not satisfy the set of static electricity potential thresholds, wherein the mobile static unit includes a corona discharge ionizer.

4. The system of claim 1, wherein the set of static sensor data includes a set of humidity data, wherein analyzing the set of static sensor data further comprises comparing the set of humidity data to a set of humidity thresholds, wherein the static condition is determined to exist if the set of humidity data does not satisfy the set of humidity thresholds, wherein the mobile static unit includes a humidifier.

5. The system of claim 1, wherein at least one mobile static unit of the one or more mobile static units is an unmanned air vehicle (UAV).

6. The system of claim 1, wherein at least one of mobile static unit of the one or more mobile static units is a rail delivery system.

7. The system of claim 1, wherein analyzing the set of mobile static unit data and selecting the mobile static unit further comprises:
   determining a location of the static condition;
   determining a location of each of the one or more mobile static units;
   comparing the location of the static condition to the location of each of the one or more mobile static units; and
   selecting the mobile static unit nearest to the static condition.

8. A computer implemented method for dynamically controlling static electricity comprising:
   obtaining a set of static sensor data from two or more static sensors, wherein the two or more static sensors are configured to obtain the set of static sensor data by sampling static indicators associated with at least one target location;
   analyzing the set of static sensor data;
   determining that a static condition exists based on the analysis;
   obtaining, in response to determining that a static condition exists, a set of mobile static unit data from one or more mobile static units;
   analyzing the set of mobile static unit data;
   selecting, based on the analysis of the mobile static unit data, a mobile static unit of the one or more mobile static units;
   transmitting an action to the selected mobile static unit; and
   deploying the selected mobile static unit to mitigate the static condition.

9. The method of claim 8, wherein analyzing the set of static sensor data further comprises generating a heat map of the static sensor data.

10. The method of claim 8, wherein the set of static sensor data includes a set of static electricity potential data, wherein analyzing the set of static sensor data includes comparing the set of static electricity potential data to a set of static electricity potential thresholds, wherein the static condition is determined to exist if the set of static electricity potential data does not satisfy the set of static electricity potential thresholds, wherein the mobile static unit includes a nuclear ionizer.

11. The method of claim 8, wherein the set of static sensor data includes a set of humidity data, wherein analyzing the set of static sensor data further comprises comparing the set of humidity data to a set of humidity thresholds, wherein the static condition is determined to exist if the set of humidity data does not satisfy the set of humidity thresholds, wherein the mobile static unit includes a humidifier.

12. The method of claim 8, wherein at least one mobile static unit of the one or more mobile static units is a multi-rotor unmanned air vehicle (UAV).

13. The method of claim 8, wherein at least one mobile static unit of the one or more mobile static units is a rail delivery system.

14. The method of claim 8, wherein analyzing the set of mobile static unit data and selecting the mobile static unit further comprises:
- determining a power level of each of the one or more mobile static units;
- comparing the power level of each of the one or more mobile static units to each other; and
- selecting the mobile static unit with the highest power level.

15. The method of claim 8, wherein transmitting the action is based on machine learning from previously obtained static sensor data and mobile static unit data.

16. A computer program product comprising a computer readable storage medium having program instructions embodied therewith, the program instructions executable by a processor to cause the processor to perform a method comprising:
- obtaining a set of static sensor data from two or more static sensors, wherein the two or more static sensors are configured to obtain the set of static sensor data by sampling static indicators associated with at least one target location;
- analyzing the set of static sensor data;
- determining that a static condition exists based on the analysis;
- obtaining, in response to determining that a static condition exists, a set of mobile static unit data from one or more mobile static units;
- analyzing the set of mobile static unit data;
- selecting, based on the analysis of the mobile static unit data, a mobile static unit of the one or more mobile static units;
- transmitting an action to the selected mobile static unit; and
- deploying the selected mobile static unit to mitigate the static condition.

17. The computer program product of claim 16, wherein the set of static sensor data includes a set of static electricity potential data, wherein analyzing the set of static sensor data includes comparing the set of static electricity potential data to a set of static electricity potential thresholds, wherein the static condition is determined to exist if the set of static electricity potential data does not satisfy the set of static electricity potential thresholds, wherein the mobile static unit includes a corona discharge ionizer with a blower fan.

18. The computer program product of claim 16, wherein the set of static sensor data includes a set of humidity data, wherein analyzing the set of static sensor data further comprises comparing the set of humidity data to a set of humidity thresholds, wherein the static condition is determined to exist if the set of humidity data does not satisfy the set of humidity thresholds, wherein the mobile static unit includes a humidifier with a blower fan.

19. The computer program product of claim 16, wherein the mobile static unit is a multi-rotor unmanned air vehicle (UAV) with a nuclear ionizer.

20. The computer program product of claim 16, wherein analyzing the set of mobile static unit data includes determining a type of static eliminator associated with each of the one or more mobile static units.

\* \* \* \* \*